United States Patent [19]
Shikatani

[11] Patent Number: 5,369,646
[45] Date of Patent: Nov. 29, 1994

[54] SEMICONDUCTOR INTEGRATED CIRCUIT DEVICE HAVING TEST CIRCUIT

[75] Inventor: Junichi Shikatani, Kawasaki, Japan
[73] Assignee: Fujitsu Limited, Kawasaki, Japan
[21] Appl. No.: 978,067
[22] Filed: Nov. 18, 1992

Related U.S. Application Data
[63] Continuation of Ser. No. 596,667, Oct. 10, 1990.

[30] Foreign Application Priority Data
Oct. 13, 1989 [JP] Japan .................... 1-266662

[51] Int. Cl.⁵ .................................... H04B 17/00
[52] U.S. Cl. ............................ 371/22.5; 371/22.6
[58] Field of Search .............. 371/22.5, 22.6, 22.2, 371/15.1, 40.4, 22.1

[56] References Cited
U.S. PATENT DOCUMENTS

| | | | |
|---|---|---|---|
| 4,701,922 | 10/1987 | Kuboki et al. | 371/22.3 |
| 4,730,320 | 3/1988 | Hidaka et al. | 371/40.4 |
| 4,752,929 | 6/1988 | Kantz et al. | 371/21.2 |
| 4,811,304 | 3/1989 | Matsuda et al. | 365/230.06 |
| 4,857,774 | 8/1989 | El-Ayat et al. | 307/465 |
| 5,065,090 | 11/1991 | Gheewala | 371/15.1 |

FOREIGN PATENT DOCUMENTS
0174236 3/1986 European Pat. Off. .
0223714 5/1987 European Pat. Off. .

OTHER PUBLICATIONS
Proceedings of the 26th Design Automation Conference, Jun. 25-29, 1989, pp. 706-709, IEEE, New York, US; T. Gheewala.

Primary Examiner—Robert W. Beausoliel, Jr.
Assistant Examiner—Phung M. Chung
Attorney, Agent, or Firm—Armstrong, Westerman, Hattori, McLeland & Naughton

[57] ABSTRACT

A semiconductor integrated circuit device includes a logic cell array having a plurality of logic cells arranged in a matrix having a plurality of rows and columns. The logic cells respectively have input terminals and output terminals. Also, the device includes interconnection lines mutually connecting the logic cells via the input and output terminals of the logic cells so that desired logic circuits are formed, and a plurality of switches which are respectively provided for the logic cells and selectively connect the output terminals of the logic cells to the interconnection lines. Further, the device includes a test circuit for directly supplying the input terminals of the logic cells with desired data used for testing the semiconductor integrated circuit device in a state where a plurality of switches selectively disconnect the output terminals of the logic cells from the interconnection lines. The output line of a cell is disconnected from the interconnection line to the input of the following cell. The interconnection line is then connected to an input/output line which is switched to an input state and the desired test signal is supplied to the input of the following cell. The state of the following cell can then be evaluated to delete errors in the cell performance.

21 Claims, 17 Drawing Sheets

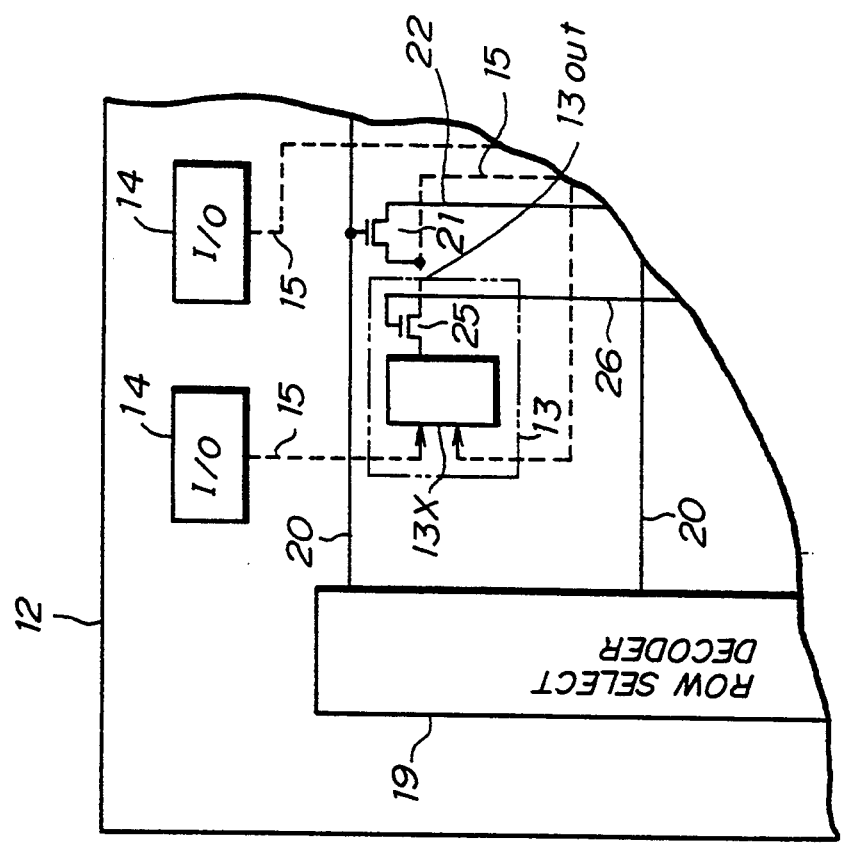

SEMICONDUCTOR INTEGRATED CIRCUIT DEVICE HAVING TEST CIRCUIT

This application is a continuation of application Ser. No. 07/596,667 filed Oct. 10, 1990.

BACKGROUND OF THE INVENTION

The present invention generally relates to a semiconductor integrated circuit device having a test circuit, and more particularly to a logic LSI device such as a gate array device or a standard cell array device having a test circuit.

There is known a semiconductor integrated circuit device having a plurality of logic cells which are coupled via interconnection lines to thereby provide desired logic circuits. Such a semiconductor integrated circuit device is called a logic LSI device. Examples of the logic LSI device are a gate array device and a standard cell array device.

The recent advance of fabricating logic LSIs provides a drastically increased number of logic cells arranged in one chip. Currently, logic LSIs having tens to hundreds of thousands of logic cells are available. As an increased number of logic cells is used, an increased number of test patters must be provided for testing logic LSIs. It takes a long time to product such test patterns and it is very difficult to determine whether or not desired logic arrangements are realized correctly. From these points of view, there is a strong need to develop semiconductor integrated circuit devices having built-in test circuits capable of easily verifying logic arrangements formed therein.

Japanese Laid-Open Patent Application No. 61-42934 proposes a semiconductor integrated circuit device having a built-in test circuit. Referring to FIG. 1, there is illustrated the outline of the proposed device. A plurality of logic cells 2 are formed on a semiconductor chip 1. A built-in test circuit is composed of row select lines 3, column read lines 4, switch elements 5, a row select ring counter 6, a column select ring counter 7, a data selector 8, a row select clock input terminal 9, a column select clock input terminal 10 and a monitor output terminal 11. The logic cells 2 are interconnected on the basis of a user's design or specification in order to provide desired logic circuits. For the sake of simplicity, such interconnections are not illustrated in FIG. 1.

Output terminals of the logic cells 2 are connected to the column read lines 4 via the switch elements 5. The row select ring counter 6 selects one of the row select lines 3, and the column select ring counter 7 selects one of the column select lines 4, so that the logic cells 2 are selected one by one. The logic state of the output terminal of a selected logic cell 2 is output to the monitor output terminal 11 via the data selector 8. In this way, information about the states of the output terminals of the logic cells 2 is obtained at the monitor output terminal 11 and used for determining whether or not desired logic circuits operate correctly.

The above-mentioned test method is called a matrix proving method or simply an MP method. According to the MP method, it is possible to read out the logic state for each logic cell 2. Thus, it is possible to design logic circuits easily, as compared with a conventional scan path method which uses flip-flops. In addition, the reliability of the MP method is high.

However, the MP method presents the following disadvantages. As has been described previously, logic circuits are based on the user's design or specification. Thus, it is necessary for the users to separately provide for respective test patterns. This is troublesome. Second, in order to set a logic cell to a desired logic state, a test pattern may pass through one or more logic cells. Thus, it is very difficult to set some of the logic cells 2 to desired states. Third, it is impossible to directly write test data into each logic cell 2. In other words, it is impossible to set the input terminal of each logic cell 2 to a desired logic state.

SUMMARY OF THE INVENTION

It is a general object of the present invention to provide an improved semiconductor integrated circuit device having a test circuit, in which the above-mentioned disadvantages are eliminated.

A more specific object of the present invention is to provide a semiconductor integrated circuit device having a test circuit, in which data can be directly and easily written into each logic cell, so that it becomes possible to easily verify logic arrangements and to detect and analyze a fault.

The above-mentioned objects of the present invention are achieved by a semiconductor integrated circuit device comprising: a logic cell array having a plurality of logic cells arranged in a matrix having a plurality of rows and columns, the logic cells respectively having input terminals and output terminals; interconnection lines mutually connecting the logic cells via the input and output terminals of the logic cells so that desired logic circuits are formed; a plurality of switch means, respectively provided for the logic cells, for selectively connecting the output terminals of the logic cells to the interconnection lines; and means for directly supplying the input terminals of the logic cells with desired data used for testing the semiconductor integrated circuit device in a state where the plurality of switch means selectively disconnect the output terminals of the logic cells from the interconnection lines.

The aforementioned objects of the present invention are achieved by a semiconductor integrated circuit device comprising: a logic cell array having a plurality of logic cells arranged in a matrix having a plurality of rows and columns, the logic cells respectively having input terminals and output terminals, wherein each of the logic cells comprises a logic circuit and switch means for selectively setting a corresponding one of the output terminals of the logic cells to either a floating state or a non-floating state; interconnection lines mutually connecting the logic cells via the input and output terminals of the logic cells so that desired logic circuits are formed; and means for directly supplying the input terminals of the logic cells with desired data used for testing the semiconductor integrated circuit device in a state where the plurality of switch means selectively disconnect the output terminals of the logic cells from the interconnection lines.

BRIEF DESCRIPTION OF THE DRAWINGS

Other objects, features and advantages of the present invention will become more apparent from the following detailed description when read in conjunction with the accompanying drawings, in which:

FIG. 9 is a circuit diagram illustrating a configuration in which a logic cell has a built-in transistor;

DESCRIPTION OF THE PREFERRED EMBODIMENTS

A description will now be given of a first embodiment of the present invention.

Figure 2:
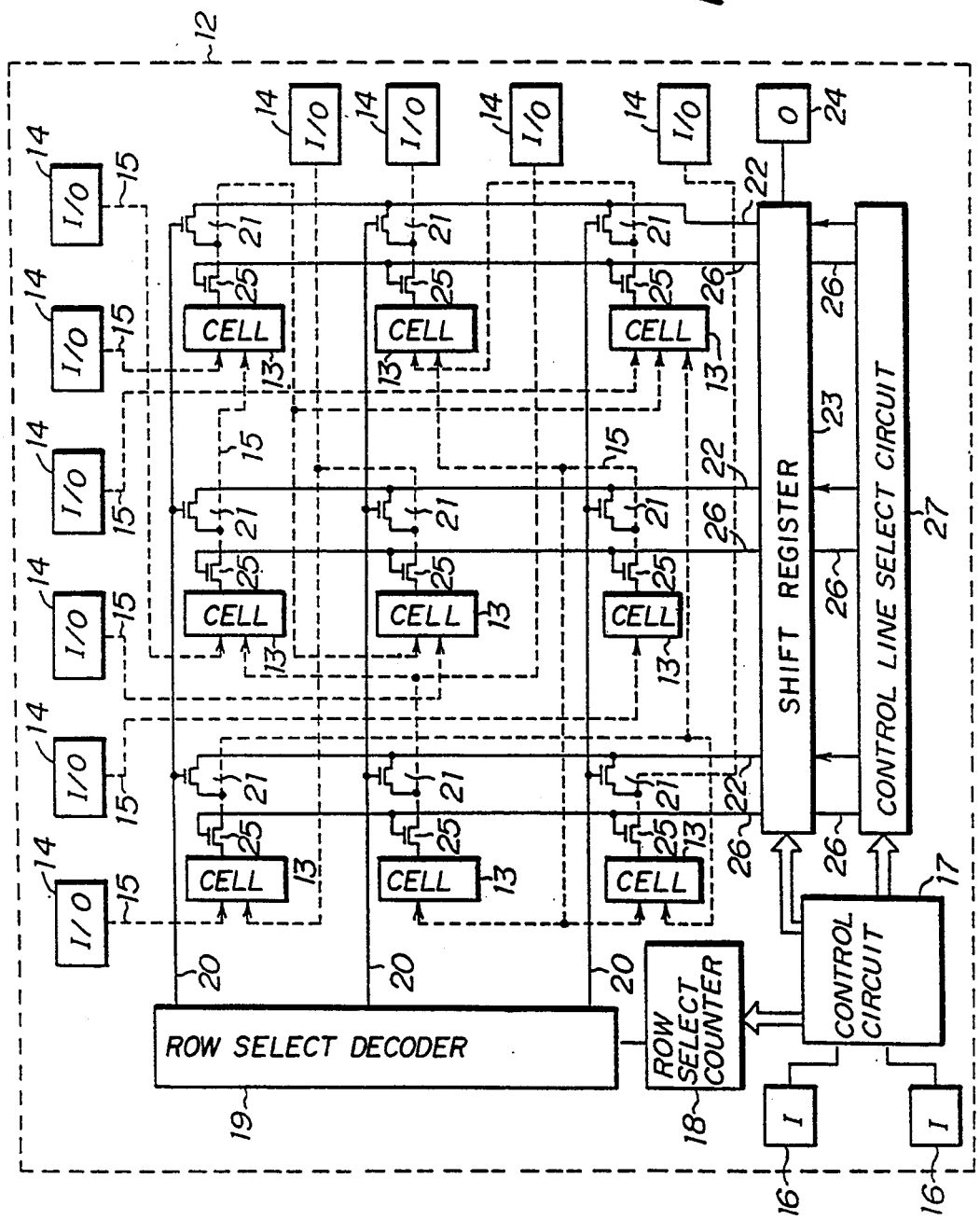
FIG. 2 is a block diagram illustrating a first preferred embodiment of the present invention.

Referring to FIG. 2, there is illustrated a semiconductor integrated circuit device having a built-in test circuit according to the first preferred embodiment of the present invention. The device shown in FIG. 2 has a semiconductor integrated circuit chip 12, logic cells 13, and input/output (I/O) buffers 14 provided for logic circuits formed by interconnecting the logic cells 13 via interconnection lines 15. It will be noted that the interconnection lines 15 used for forming desired logic circuits are illustrated by broken lines in order to visually distinguish them from connection lines for a test circuit which will be described in detail later. The interconnection lines 15 are also used for connecting some of the logic cells 13 and the I/O buffers 14.

Also, the device shown in FIG. 2 has an input buffer 16 for inputting a test signal, a control circuit 17 for test, a row select counter 18, a row select decoder 19, row select lines 20, n-channel field effect transistors (hereinafter simply referred to as nMOS transistors) 21, column read/write lines 22, a shift register 23, an output buffer 24 for outputting data, nMOS transistors 25, control lines 26 and a control line select circuit 27.

Each of the logic cells 13 has one or two input terminals coupled to the corresponding I/O buffers 14 or one or two output terminals of the logic cell or cells 13. An output terminal of each logic cell 13 is connected to the corresponding interconnection line 15 or the I/O buffer 14 via the corresponding nMOS transistor 25. The gate of each nMOS transistor 25 is connected to the corresponding control line 26. A first terminal (source or drain) of each nMOS transistor 21 is connected to the source of the corresponding nMOS transistor 25, and a second terminal (drain or source) of each MOS transistor 21 is connected to the corresponding column read/write line 22.

In short, the operation of the device shown in FIG. 2 is as follows. When the nMOS transistor 25 being considered is turned ON by setting the corresponding control line 26 to a high level, the output terminal of the corresponding logic cell 13 is connected to the corresponding interconnection line 15 or the I/O buffer 14. In this state, when the corresponding nMOS transistor 21 is turned ON by setting the corresponding row select line 20 to a high level, data stored in the logic cell being considered is read out therefrom and output to the corresponding column read/write line 22 via the nMOS transistors 25 and 21. That is, the status of the output terminal of the logic cell 25 being considered is output to the column read/write line 22. The data is then shifted by the shift register 23 and then sent to the output buffer 24.

When the nMOS transistor 25 is set to OFF and the corresponding nMOS transistor 21 is set to ON, the corresponding column read/write line 22 is connected to the corresponding interconnection line 15 via the nMOS transistor 21. Thus, test data is output to the column read/write line 22 via the input buffers 16, the control circuit 17 and the shift register 23, and then output to the corresponding interconnection line 15 via the nMOS transistor 21. Then, the test data is input to the corresponding input terminal of the logic cell 13 connected to the above interconnection line 15. Thus, it is possible to respectively set the input terminal(s) of each logic cell 13 to a desired logic state. After that, the nMOS transistors 25 and 21 related to the logic cell 13 supplied with the test data via the corresponding interconnection line 15 are turned ON, and the logic state of the output terminal thereof is output to the corresponding column read/write line 22 via these nMOS transistors 25 and 21.

The control circuit 17 for use in the test receives test signals including a reference clock signal, a mode select signal specifying either a normal mode or a test mode and an input data signal via the input buffers 16 and generates various signals. More specifically, the control circuit 17 generates a clock signal, a clear signal, a load signal, a load data signal and an enable signal, all of which are supplied to the row select counter 18. Also, the control circuit 17 generates a clock signal and passes the input data signal, both of which signals are supplied to the shift register 23. Further, the control circuit 17 generates a clock signal and a control line select data signal, both of which are supplied to the control line select circuit 27.

Figure 3:
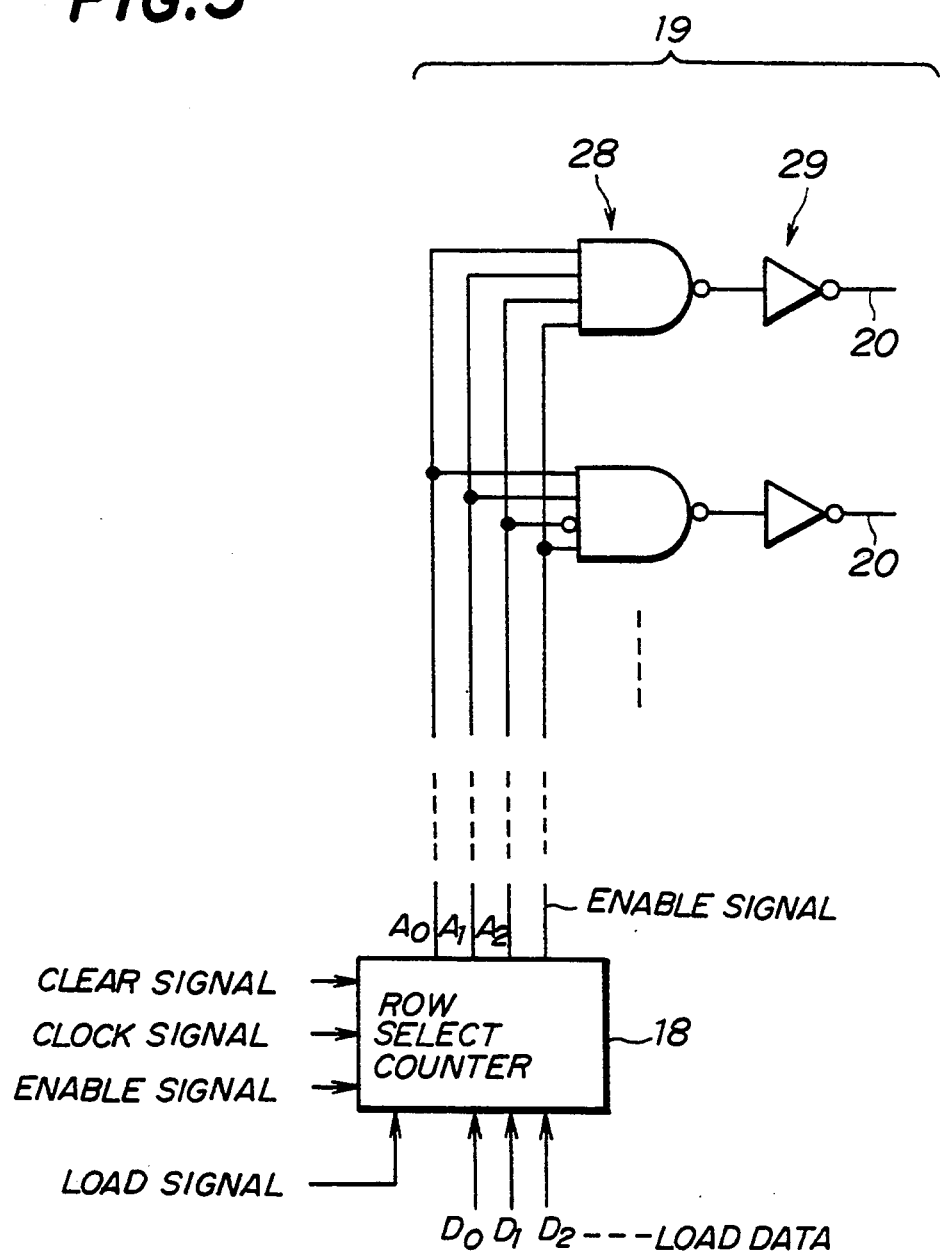
FIG. 3 is a circuit diagram illustrating a row select counter and a row select decoder shown in FIG. 2.

The row select counter 18 and the row select decoder 19 form a row select circuit, which has a configuration as shown in FIG. 3. The row select counter 18 counts the clock signal supplied from the control circuit 17 after it is cleared by the clear signal also supplied therefrom, and sequentially outputs an address composed of address bits A0, A1, A2, . . . The row select counter 18 is also supplied with the load signal from the control circuit 17 and set to an initialization enable state. Then, the load data signal composed of load data D0, D1, D2, ... are input to the row select counter 18. The column decoder 19 is composed of an array of NAND gates 28 and an array of inverters 29. The NAND gates 28 and the inverters 29 decode the address signal composed of A0, A1, A2, ..., and selects one of the row select lines. The enable signal is supplied to the NAND gates 28 of the row select decoder 19. When the enable signal is inactive in the normal mode, none of the row select lines 20 are selected.

Figure 4:
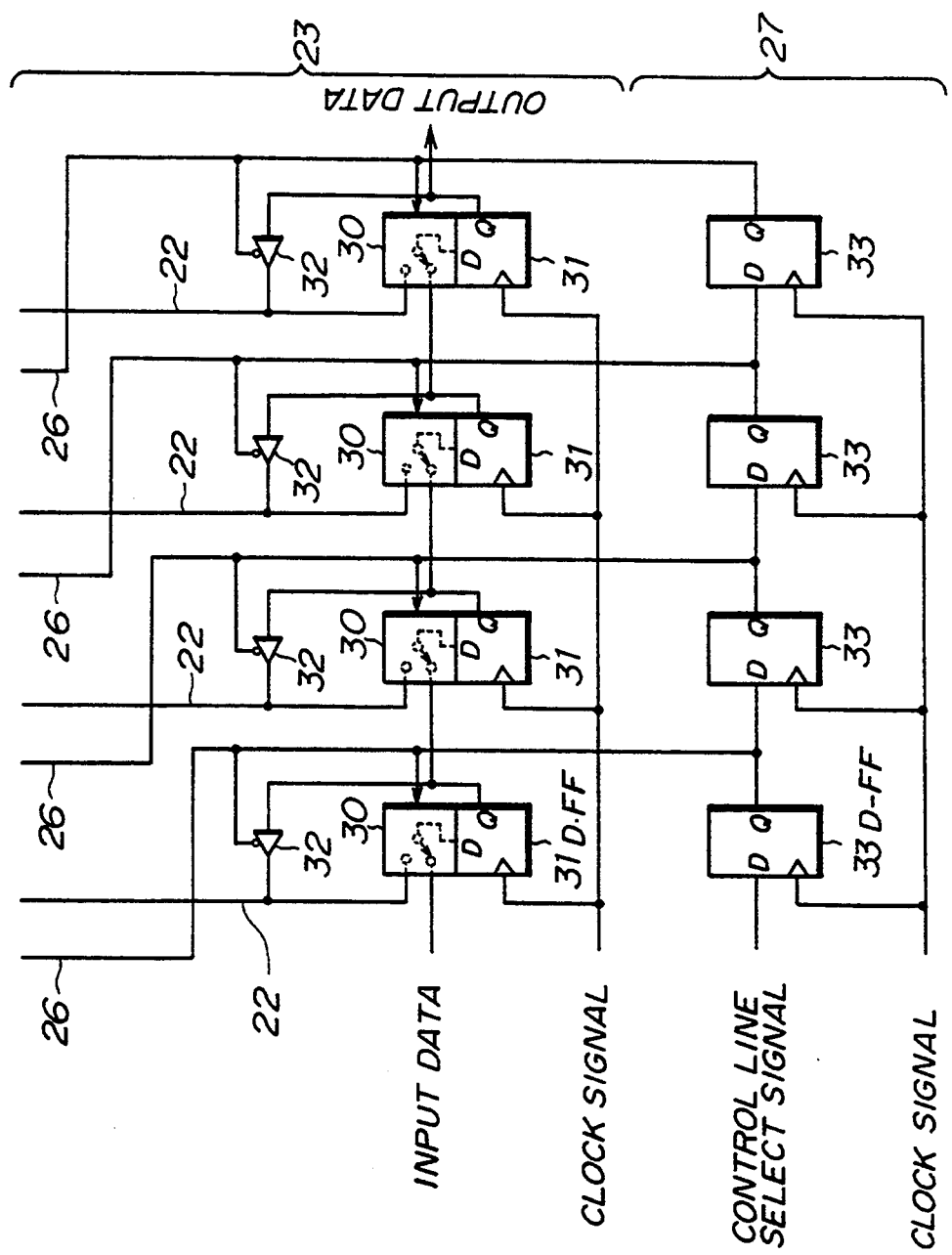
FIG. 4 is a circuit diagram of a shift register and a control line select circuit shown in FIG. 2.

Referring to FIG. 4, there is illustrated the configuration of the shift register 23 and the configuration of the control line select circuit 27. The shift register 23 shown in FIG. 4 is composed of selectors 30, D-type flip-flops 31 and tristate (three-state) buffers 32. The shift register 23 functions to output input data used for setting the logic states of the logic cells 13 to the column read/write lines 22 and to receive data representing the logic states of the output terminals of the logic cells 13 from the column read/write lines 22 and output the same to the output buffer 24.

Under the control of the control line select circuit 27, each of the selectors 30 functions to select either the output of each of the corresponding logic cell 13 obtained via the corresponding column read/write line 22 or the input data supplied via the control circuit 17 and to output the selected data to an input terminal D of the corresponding flip-flop 31. Each of the tristate buffers 32 is ON when data is being written in the selected logic cell 13, and OFF when data is read out therefrom under the control of the control line select circuit 27.

The control line select circuit 27 controls the shift register 23 on the basis of the control line select signal supplied from the control circuit 17, and executes the ON/OFF control of the nMOS transistors 25 via the control lines 26. The control line select circuit 27 shown in FIG. 4 is formed of a shift register composed of cascaded D-type flip-flops 33. An output terminal Q of each of the flip-flops 33 is connected to a control terminal of the corresponding selector 30, a control terminal of the corresponding tristate buffer 32 and the control line 26.

Figure 5:
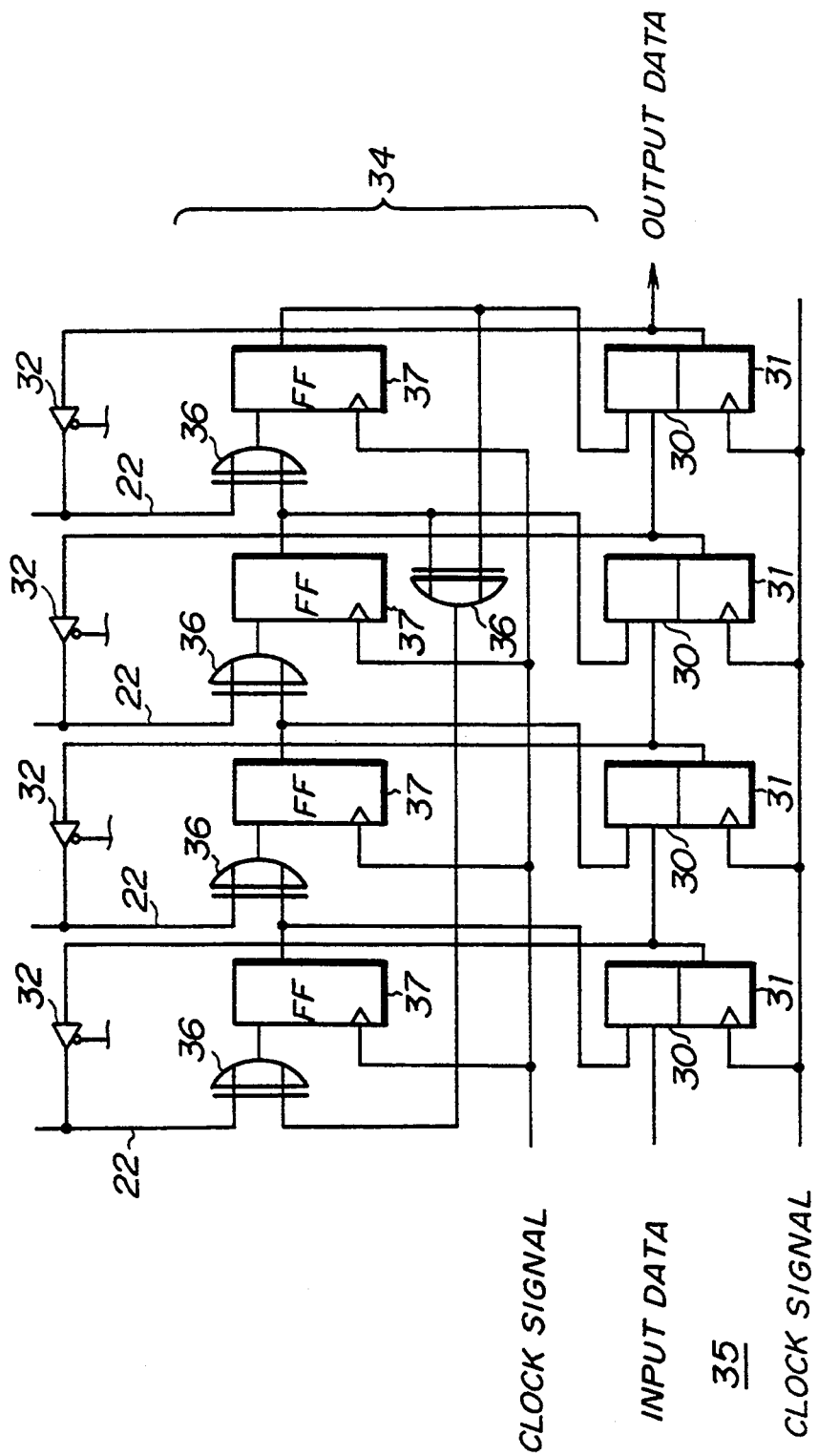
FIG. 5 is a circuit diagram illustrating an alternative of the shift register shown in FIG. 4.

As shown in FIG. 5, the shift register 23 can be replaced by a shift register 35 which is combined with a data compression circuit 34. In FIG. 5, those parts which are the same as those shown in FIG. 4 are given the same reference numerals. The data compression circuit 34 is composed of exclusive-OR gates 36 and D-type flip-flops 37.

The description will now be given of the operation of the semiconductor integrated circuit device according to the first preferred embodiment of the present invention. It is possible to execute the test in a first test mode or a second test mode. The first test mode is the same as that performed by the conventional method. In the second test mode, desired data is written into a desired logic cell.

Figure 1:
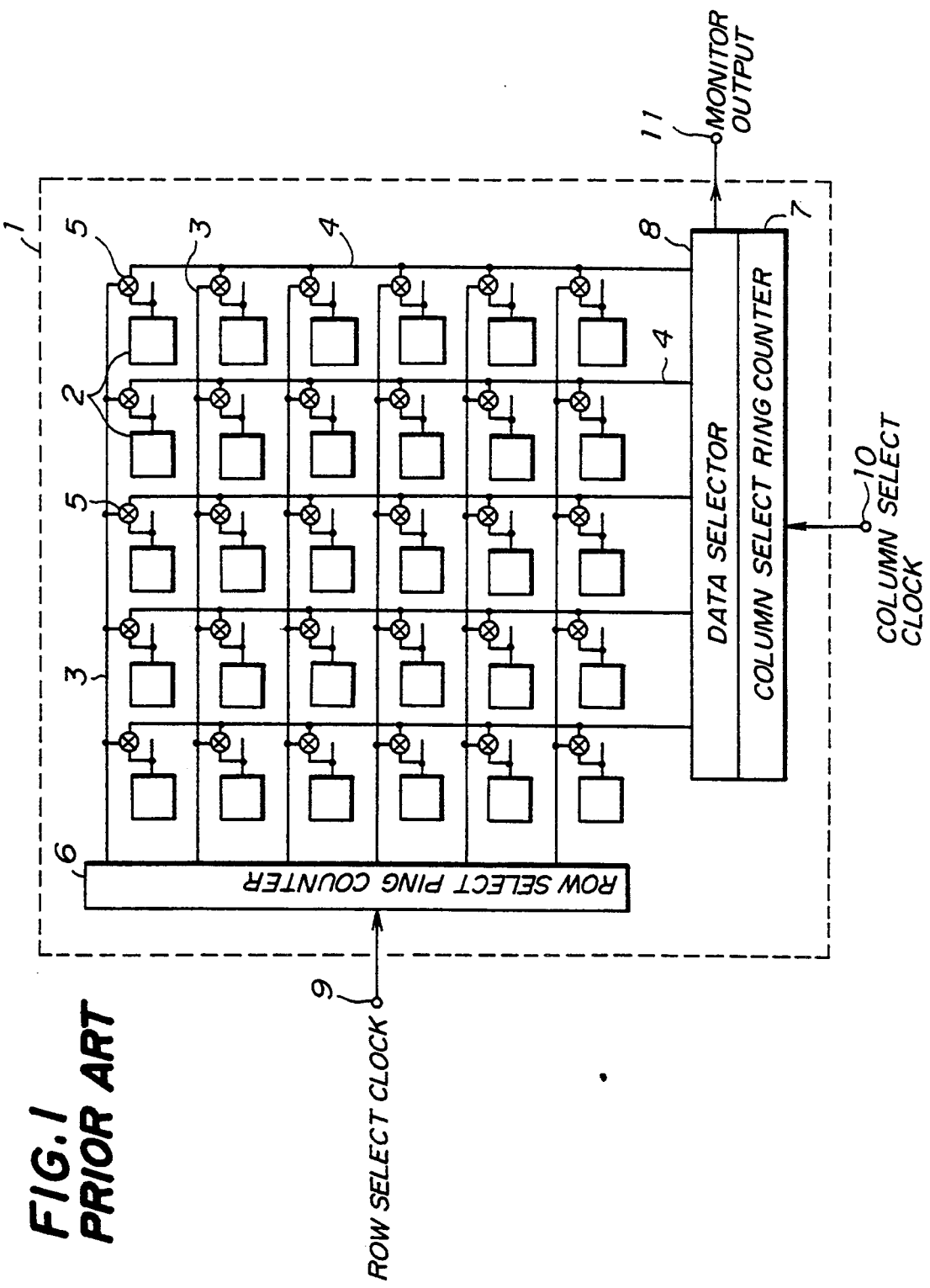
FIG. 1 is a block diagram illustrating a conventional semiconductor integrated circuit device having a built-in test circuit.

First, the first test mode will be explained. In the first test mode, all the nMOS transistors 25 are maintained in the ON state. In this state, the peripheral circuit of each logic cell 13 is equivalent to the configuration shown in FIG. 1. Then, a test pattern is input via the I/O buffers 14, and the row select lines 20 are sequentially selected so that the nMOS transistors 21 are sequentially turned ON for every row. Thereby, the logic states of the output terminals of the logic cells 13 are read out for every row via the shift register 23 and the output buffer 24.

Figure 6:
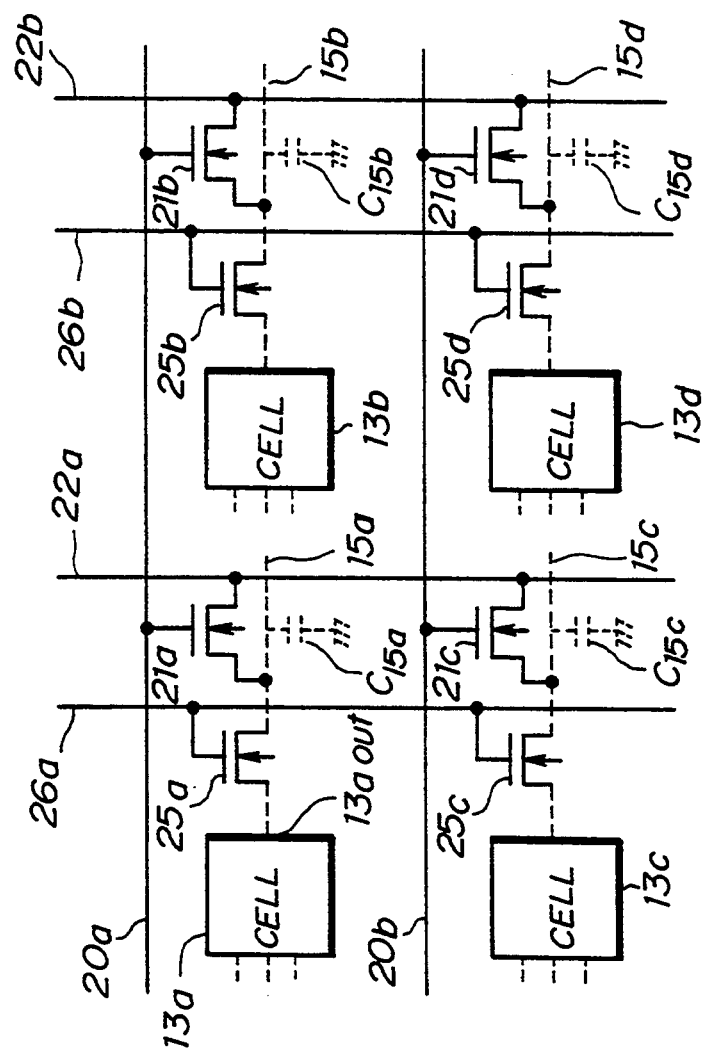
FIG. 6 is a circuit diagram illustrating the operation of the first embodiment of the present invention shown in FIG. 2.

Next, the second test mode will be described with reference to FIGS. 6, 7 and 8. Referring to FIG. 6, there is illustrated a part of the configuration shown in FIG. 2. It is now considered that desired data (a desired logic signal) is to be supplied to a logic cell located at a stage following a logic cell 13a. A control line 26a is set to the low level (L) after the outputs of all the logic cells 13a, 13b, ... are settled, so that an nMOS transistor 25a is turned OFF. Next, an output terminal 13aout of the logic cell 13a is electrically disconnected from an interconnection line 15a. Then, a row select line 20a is set to the high level (H), so that an nMOS transistor 21a is turned ON, and a row read/write line 22a is changed from an output state to an input state. After that, the desired data (desired logic signal) is supplied to the logic cell following the logic cell 13a via the interconnection line 15a. Then, the row select line 20a is released from the selected state, so that the nMOS transistor 21a is turned OFF. Thereby, the interconnection line 15a loses a current path. Due to the existence of a parasitic capacitance C15a coupled to the interconnection line 15a, the above-mentioned desired data is held therein for a certain time (enough to test the logic cell being considered). In this way, the input terminal of the logic cell being considered is set to a desired logic state.

In the same way, it is possible to supply the input terminal of a logic cell being considered with desired data via the logic cell of the preceding stage and set the same to a desired logic state. Then, data of the logic cell is read out via the output terminal thereof, and it is determined, on the basis of the readout data, whether or not the logic cell being considered operate correctly.

Figure 7:
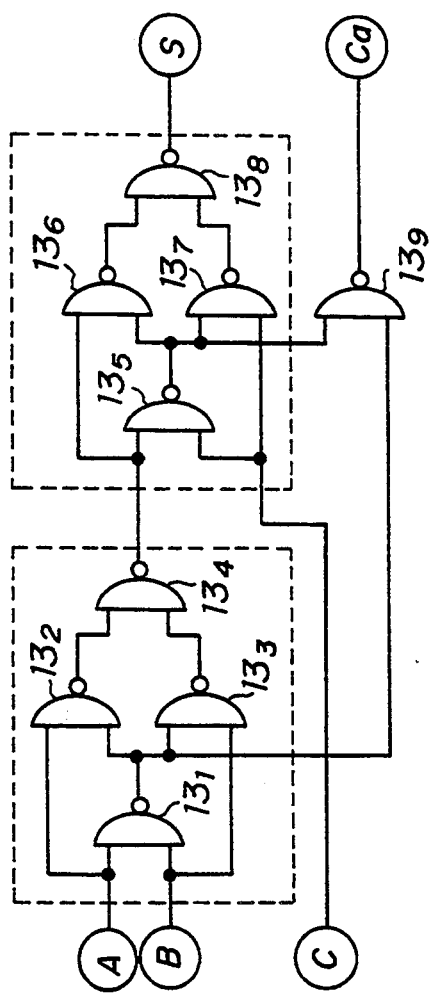
FIG. 7 is a circuit diagram of an adder circuit formed by logic cells.
Figure 8:
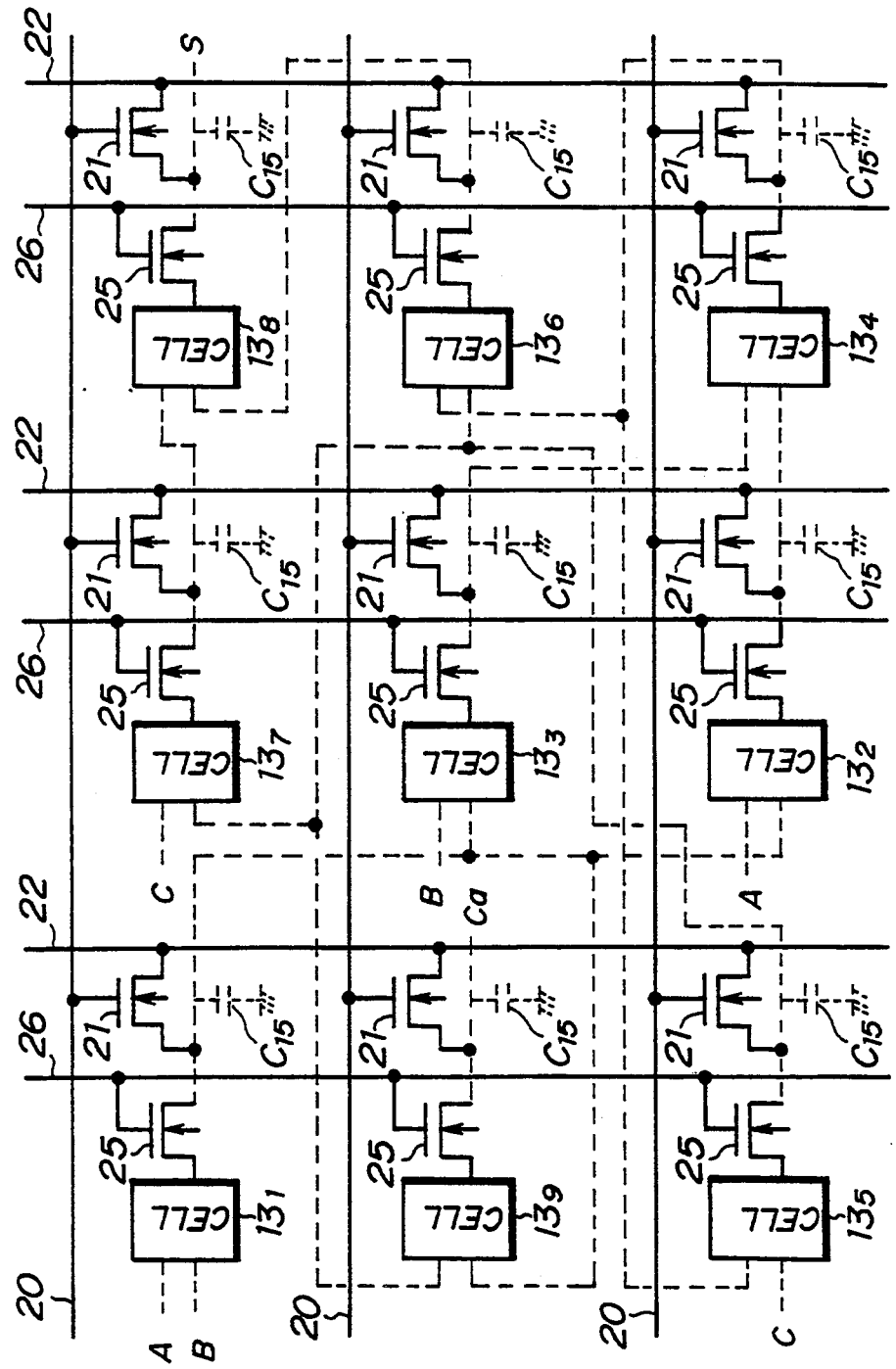
FIG. 8 is a circuit diagram of a configuration obtained by applying the first embodiment of the present invention shown in FIG. 2 to the adder circuit shown in FIG. 7.

FIG. 7 is a circuit diagram of an adder circuit formed by some of the logic cells 13 shown in FIG. 2. FIG. 8 is a block diagram of a configuration obtained by applying the above-mentioned first embodiment of the present invention to the adder circuit shown in FIG. 7. The adder circuit shown in FIG. 7 is composed of NAND gates $13_1$ through $13_9$. Two input signals A and B are input to the NAND gate $13_1$, and a carry signal C from a logic cell of the preceding stage is applied to the NAND gates $13_5$ and $13_7$. An addition result S is output via the NAND gate $13_8$, and a carry signal Ca addressed to the next stage is output via the NAND gate $13_9$.

If desired data are respectively supplied to two input terminals of the logic cell $13_4$, the nMOS transistors 25 connected to the logic cells $13_2$ and $13_3$ are turned OFF, and the desired data are supplied to the input terminals of the logic cell $13_4$ via the nMOS transistors 21 related to the logic cells $13_2$ and $13_3$, respectively.

It is possible to consider that each logic cell 13 shown in FIG. 2 has the nMOS transistor 25, as shown in FIG. 9. In other words, the output terminal of each logic cell 13 is formed by the source terminal of the nMOS transistor 25. In order to clearly distinguish the configuration shown in FIG. 9 from that shown in FIG. 2, each logic cell 13 shown in FIG. 9 is composed of a logic circuit part 13X and the nMOS transistor 25. In the arrangement shown in FIG. 9, it can be said that the nMOS transistor 25 functions as a means for selectively setting an output terminal 13out of the logic cell 13 to either a floating state or a non-floating state.

Figure 10A:
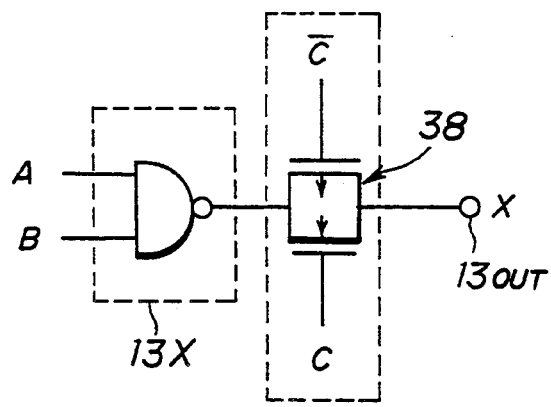
FIG. 10A is a circuit diagram illustrating a means for selectively setting an output terminal of each logic circuit to a floating state or a non-floating state.

In place of the nMOS transistor 25 shown in FIG. 9, as shown in FIG. 10A, it is possible to employ an analog switch 38 which is composed of a pair of pMOS transistor and nMOS transistor and which is interposed between the output terminal of the logic circuit part 13X and the output terminal 13out of the logic cell 13. The analog switch 38 functions to selectively set the output terminal 13out to either floating state or the non-floating state. The control signal labeled C via the control line 26 and its inverted version $\overline{C}$ thereof are applied to the analog switch 38. The inverted version of the control signal $\overline{C}$ is obtained by inverting the control signal C by an inverter (not shown for the sake of simplicity).

Figure 10B:
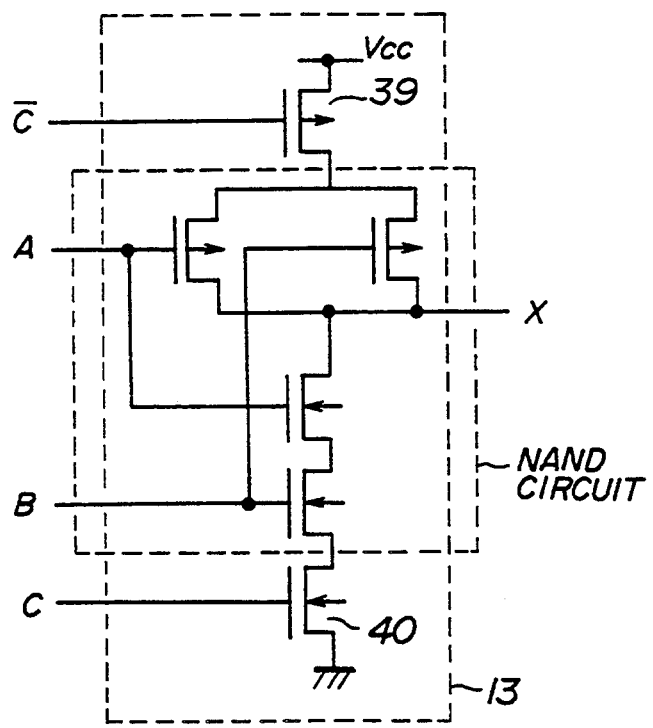
FIG. 10B is a circuit diagram of an alternative of the circuit shown in FIG. 10A.

As shown in FIG. 10B, it is also possible to substitute a pMOS transistor 39 and an nMOS transistor 40 for the nMOS transistor 25 (FIG. 9) when the logic circuit part 13X is an NAND circuit. The NAND circuit is connected to a positive power supply line Vcc via and a negative power supply line (ground in the configuration shown in FIG. 10B) via the pMOS and nMOS transistors 39 and 40, respectively.

Figure 11:
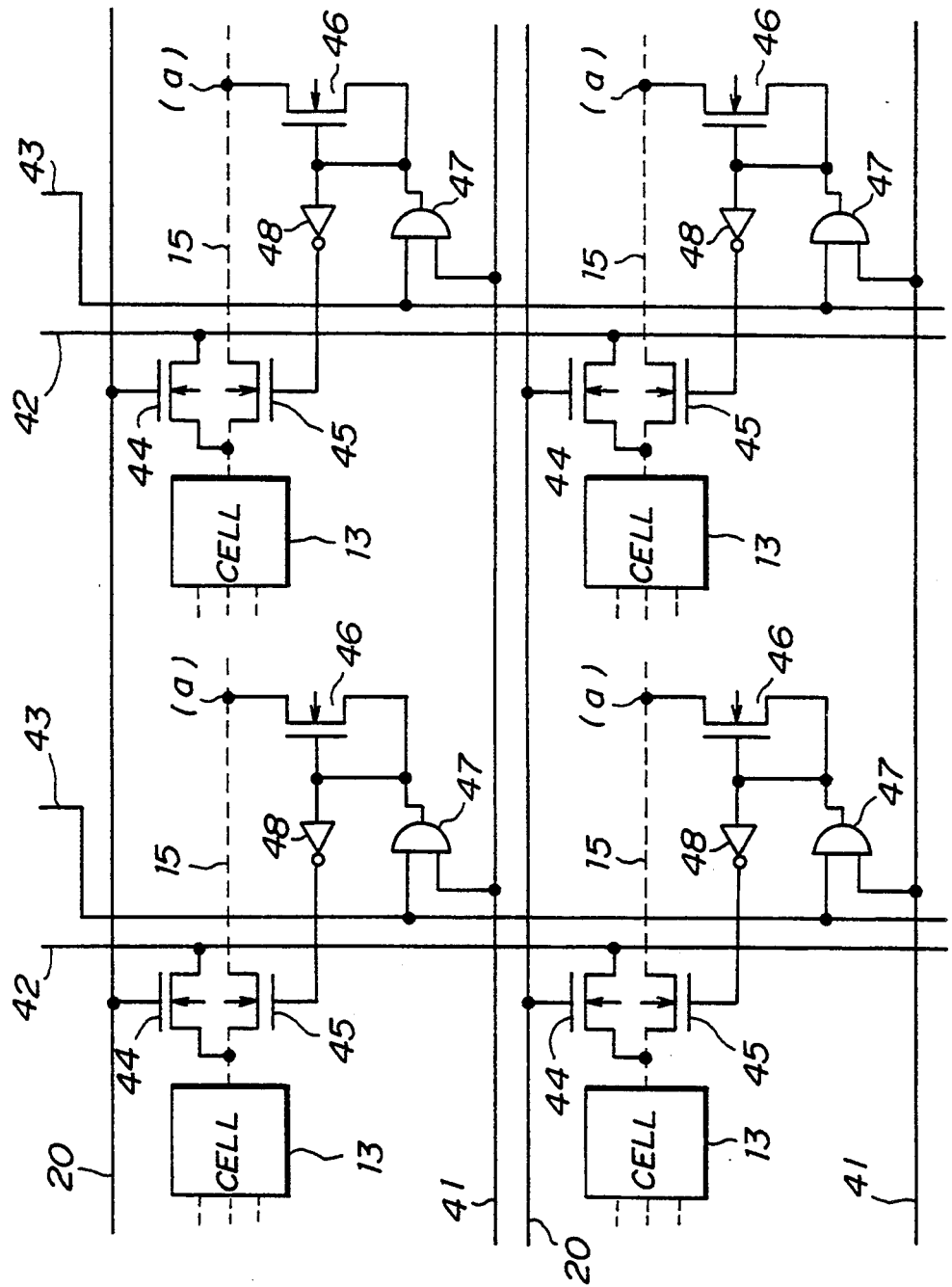
FIG. 11 is a circuit diagram of a second embodiment of the present invention.

A description will now be given of a second preferred embodiment of the present invention. Referring to FIG. 11, there is illustrated a semiconductor integrated circuit device according to the second preferred embodiment of the present invention. In FIG. 11, those parts which are the same as those shown in the previous figures are given the same reference numerals.

The output terminal of each logic cell 13 is connected to the corresponding interconnection line 15 used for forming a desired logic arrangement via an nMOS transistor 45. The output terminal of each logic cell 13 is also coupled to a column read line 42 via an nMOS transistor 44. The gate of each nMOS transistor 44 is connected to the corresponding row select line 20. Control lines 41 run along respective arrangements of logic cells 13 in the row direction, and control lines 43 run along respective arrangements of logic cells 13 in the column direction.

A logic setting circuit composed of an nMOS transistor 46, an AND gate 47 and an inverter 48 is provided for each logic cell 13. The AND gate 47 has two input terminals respectively connected to the control lines 41 and 43, and an output terminal connected to the drain and gate of the nMOS transistor 46 as well as an anode terminal of the inverter 48. A cathode terminal of the inverter 48 is connected to the gate of the nMOS transistor 45. The column read lines 42 and the control lines 43 extend from a circuit 27A shown in FIG. 12, which is composed of the shift register 23 and the control line select circuit 27 shown in FIG. 2. The row select lines 20 and the control lines 41 extend from a circuit 19A shown in FIG. 12, which is composed of the row select decoder 19 and a control line select circuit which is configured in the same as the control line select circuit 27.

Figure 12:
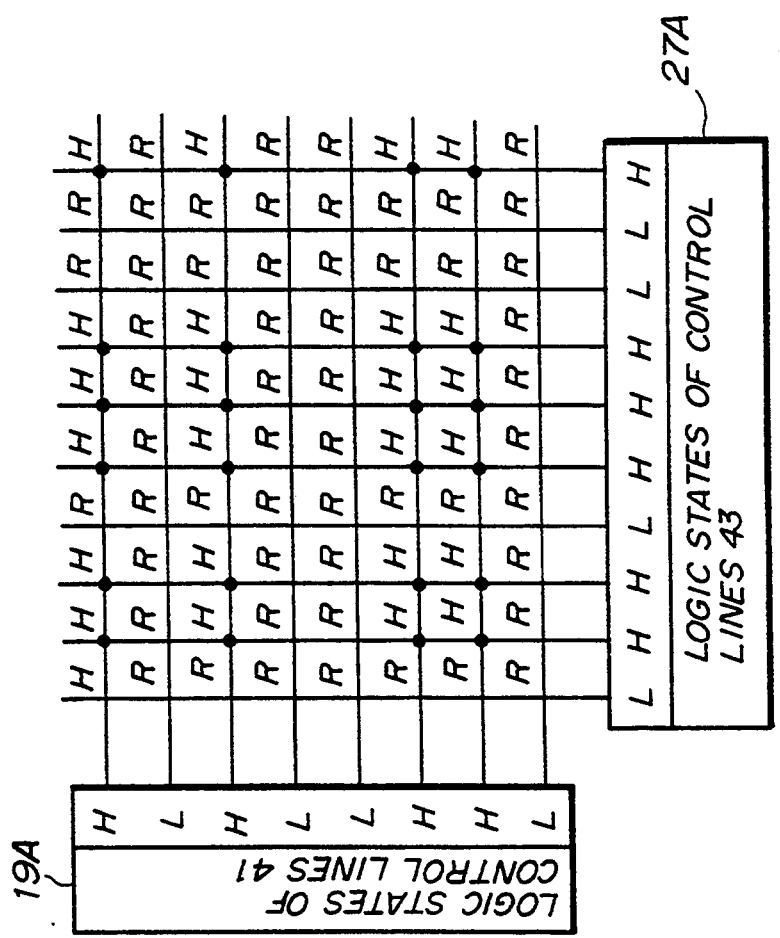
FIG. 12 is a diagram illustrating the operation of the second embodiment of the present invention shown in FIG. 11.

According to the configuration shown in FIGS. 11 and 12, when both the control lines 41 and 43 are set to the high level, the nMOS transistors 45 and 46 are turned OFF and ON, respectively, so that a node (a) where the source of the nMOS transistor 46 is connected to the interconnection line 15, is set to the high level. Thus, it is possible to supply the input terminal of the logic cell 13 of the next stage with the high level.

FIG. 12 also shows the relationship among the logic states of the control lines 41 and 43 and the logic states of the nodes (a). A character "H" or "R" located on the upper right side of each cross point indicates the logic state of the corresponding node (a). Character "H" denotes the high level, and character "R" denotes a state where no data is written into the corresponding logic cell 13. A black dot at the cross point indicates where the node at this cross point is at the high level (H). With the above-mentioned configuration, it becomes possible to set the input terminal of each logic cell 13 to a desired logic state in the above-mentioned way different from that of the aforementioned first embodiment of the present invention. In other words, according to the second preferred embodiment of the present invention, it is possible to apply data for the test to the input terminal of the logic cell 13 without passing the same through the column read line 42 and the nMOS transistor 44.

Alternatively, it is possible to set the input terminal of the logic cell 13 to the low level. In this case, for example, the nMOS transistor 46 shown in FIG. 11 is replaced by a pMOS transistor, and the AND gate 47 is replaced by a NAND gate. The gate of the pMOS is connected directly to the gate of the nMOS transistor 45 without passing through the inverter 48. That is, the inverter 48 is omitted.

Figure 13:
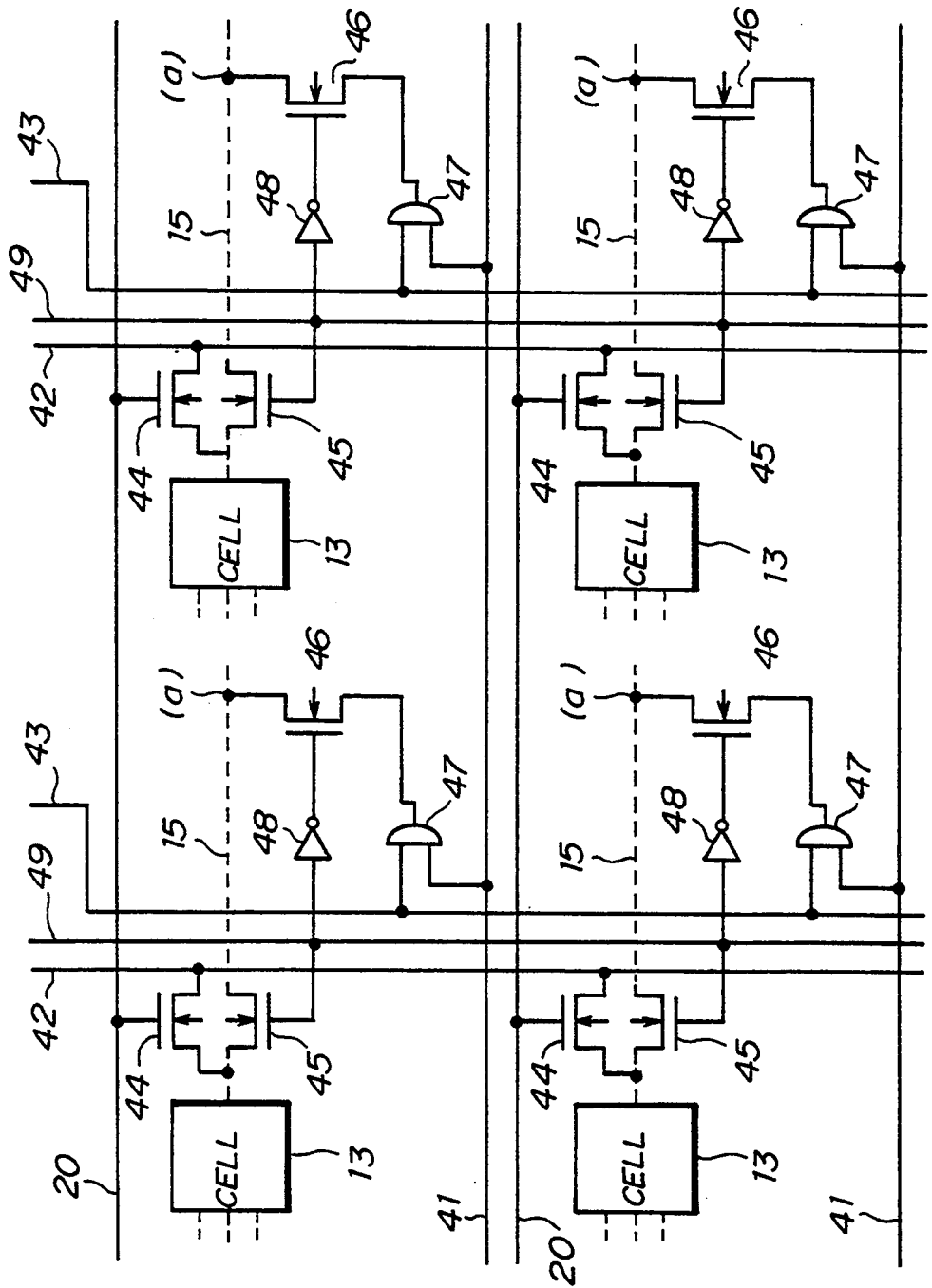
FIG. 13 is a circuit diagram of a third preferred embodiment of the present invention.

A description will now be given of a third preferred embodiment of the present invention. Referring to FIG. 13, there is illustrated a semiconductor integrated circuit device according to the third preferred embodiment of the present invention. In FIG. 13, those parts which are the same as those shown in FIG. 11 are given the same reference numerals. According to the third embodiment of the present invention, it is possible to set the input terminal of each logic cell 13 to either high level or low level.

Control lines 49 run along the respective arrangements of memory cells 13 in the column direction. The anode terminals of the inverters 48 are connected to the corresponding control lines 49, and the gates of the corresponding nMOS transistors 45. The cathode terminals of the inverters 48 are connected to the gates of the corresponding nMOS transistors 46.

Figure 14:
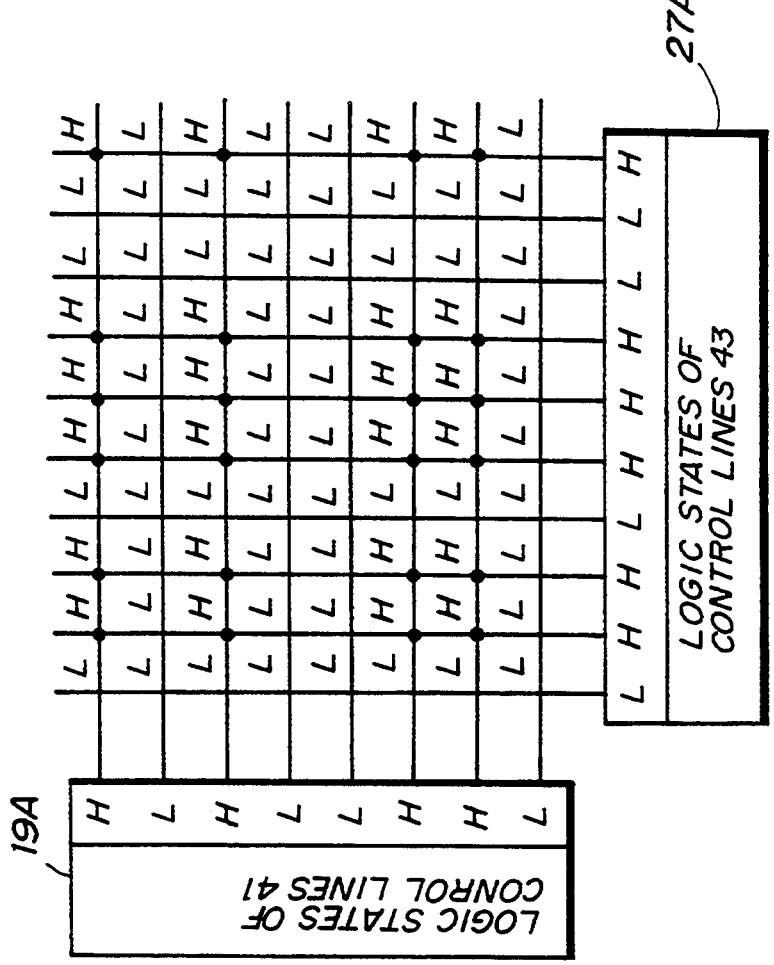
FIGS. 14 and 15 are diagrams respectively illustrating the operation of the third embodiment of the present invention shown in FIG. 13.

FIG. 14 illustrates the relationship among the logic states of the control lines 41 and 43 and the logic states of the nodes (a) in a case where the control lines 49 are maintained at the low level. When both the control lines 41 and 43 are set to the high level, the corresponding node (a) is set to the high level. On the other hand, when one or none of the control lines 41 and 43 are set to the low level, the corresponding node (a) is set to the low level.

Figure 15:
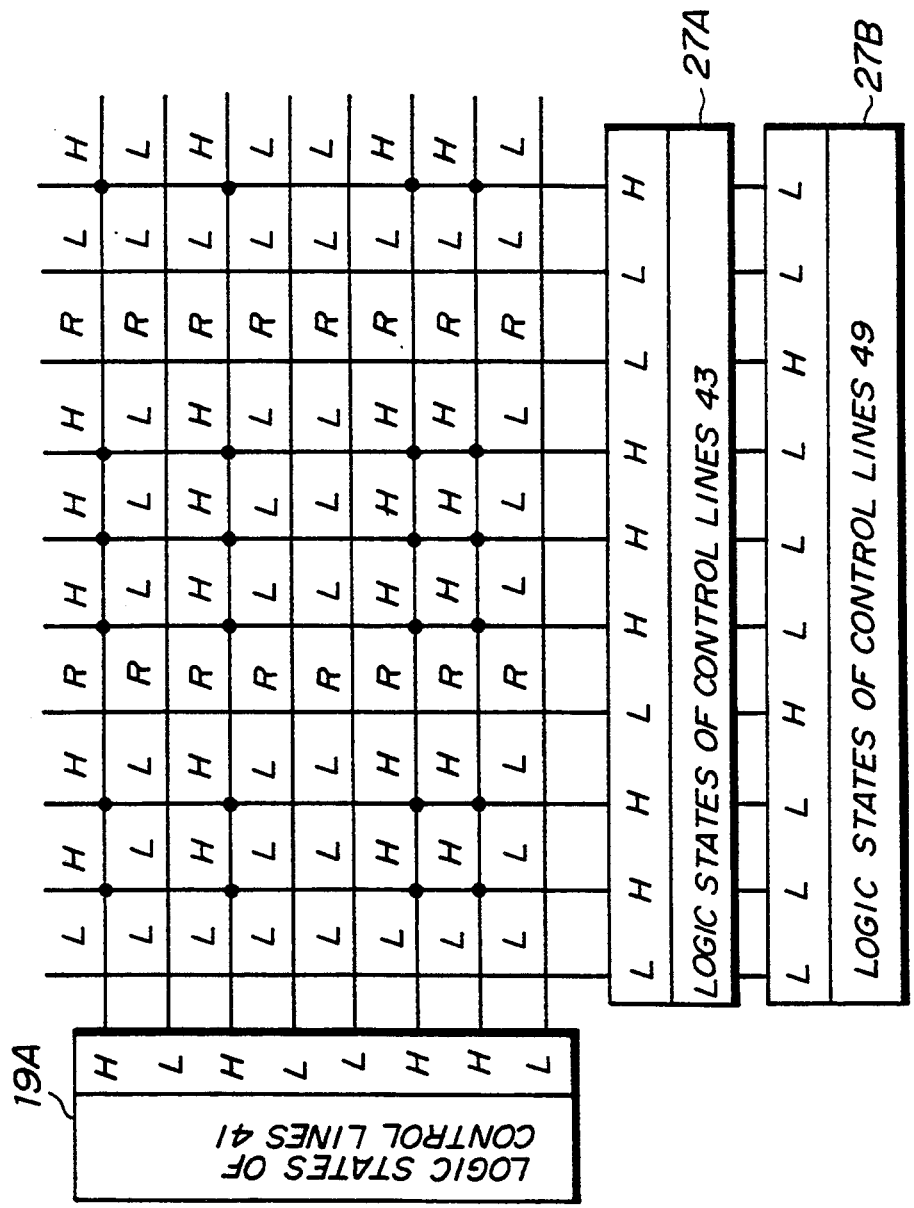

FIG. 15 illustrates the relationship among the logic states of the control lines 41, 43 and 49 and the logic states of the nodes (a). The control lines 49 extend from a circuit 27B, which is configured in the same way as the circuit 27A. When the control lines 49 are at the high level, the nMOS transistors 45 coupled thereto are turned ON, and the nMOS transistors 46 coupled thereto via the inverters 48 are turned OFF. Thus, the output data stored in the logic cells 13 appear at the nodes (a) indicated by characters "R".

The following shows the logic states of the lines 41, 43 and 49, the output of the inverter 48, the output of the AND 47 and the node a:

| 41 | L | H |
|---|---|---|
| 43 | H | H |
| 49 | H | H |
| output of inverter 48 | L | L |
| output of AND 47 | L | H |
| node a | R | R |

Therefore, when the line 49 is H, the transistor 45 is ON and the transistor 46 is OFF. That is, when the line 49 is H, data in the cell 13 appears at node a irrespective of the logic states of the lines 41 and 43.

Figure 16:
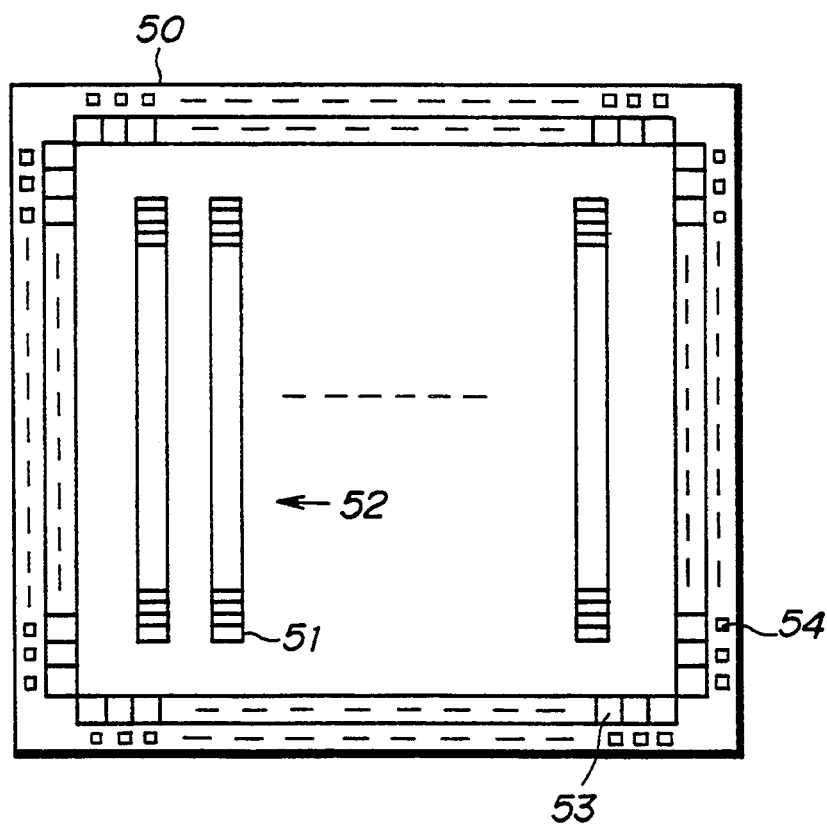
FIG. 16 is a plan view illustrating a gate array device to which the present invention can be applied.

The present invention is suitable for gate array devices. However, the present invention includes standard cell array devices. FIG. 16 illustrates a gate array device having interconnection channels (see Japanese Laid-Open Patent Application No. 54-93375). The device shown in FIG. 16 is composed of a gate array chip 50, basic cells 51, columns 52 of basic cells 51 I/O cells 53 and pads 54.

Figure 17:
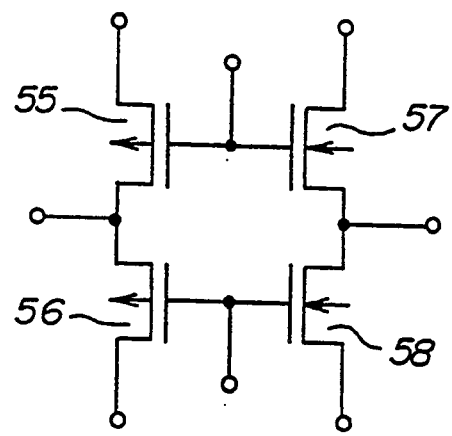
FIG. 17 is a circuit diagram of a basic cell shown in FIG. 16.
Figure 18:
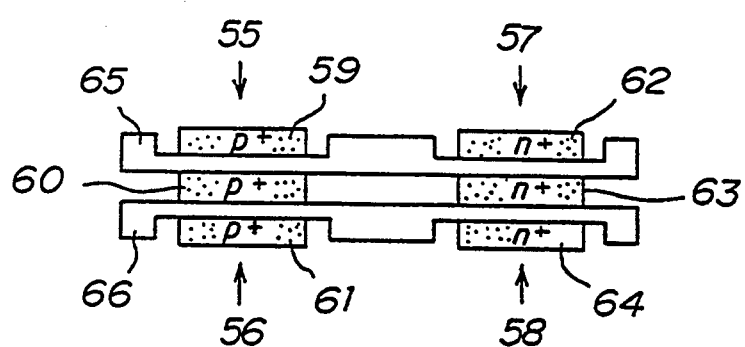
FIG. 18 is a plan view of a pattern of the basic cell shown in FIG. 17.

FIG. 17 is a circuit diagram of each basic cell 51. As shown, the basic cell 51 is composed of two pMOS transistors 55 and 56, and two nMOS transistors 57 and 58. FIG. 18 is a plan view of each basic cell 51. The pMOS transistor 55 is formed by p+-type diffusion regions 59 and 60 and a gate electrode 65, and the pMOS transistor 56 is formed by p+-type diffusion regions 60 and 61, and a gate electrode 66. The nMOS transistor 57 is formed by n+-type diffusion regions 62 and 63 and the gate electrode 65, and the nMOS transistor 58 is formed by n+-type diffusion regions 63 and 64, and the gate electrode 66.

It is also possible to apply the present invention to a channeless type gate array device, as disclosed in Japanese Laid-Open Patent Application No. 63-306639.

The present invention is not limited to the specifically disclosed embodiments, and variations and modifications may be made without departing from the scope of the present invention.

What is claimed is:

1. A semiconductor integrated circuit device, comprising:
    a logic cell array having a plurality of logic cells arranged in a matrix having a plurality of rows and columns, said logic cells respectively having input terminals and output terminals;
    interconnection lines mutually connecting said logic cells via said input and output terminals of the logic cells so that desired logic circuits are formed;
    a plurality of selectively actuable switch means, respectively provided for said logic cells, for selectively connecting the output terminals of each of said logic cells to said interconnection lines; and
    means for selectively directly supplying the input terminals of a selected one of said logic cells with desired data used for testing said semiconductor integrated circuit device;
    means for coordinating said data supply with control of said plurality of selectively actuable switch means to selectively disconnect the output terminals of said logic cells from said interconnection lines, and
    means for accessing said selected logic cell for evaluation of data within said cell;
    wherein said plurality of selectively actuable switch means respectively comprise transistors, each provided between a corresponding one of the logic cells and a corresponding one of the interconnection lines, said transistors respectively having ON/OFF control terminals; and
    said semiconductor integrated circuit device comprises select means for selecting said logic cells for every column and for applying a select signal to the ON/OFF control terminals of said transistors related to a selected one of the columns so that said transistors related to said selected one of said columns are turned OFF when said logic cells related to said selected one of the columns are to be disconnected from corresponding interconnection lines of said interconnection lines and said desired data is to be respectively supplied to the input terminals of said logic cells connected to said transistors related to said selected one of the columns via said corresponding interconnection lines.

2. A semiconductor integrated circuit device as claimed in claim 1, further comprising control lines respectively provided for said columns,
    wherein said control lines couple the ON/OFF control terminals of said transistors and said select means, and respectively carry said column select signal.

3. A semiconductor integrated circuit device as claimed in claim 1, further comprising shift register means for outputting said desired data received from an external device to said plurality of selectively actuable switch means and for outputting data read out from said logic cells via said plurality of selectively actuable switch means to said external device.

4. A semiconductor integrated circuit device as claimed in claim 1, wherein each of said transistors is a field effect transistor having a gate terminal, and said ON/OFF control terminal corresponds to said gate terminal.

5. A semiconductor integrated circuit device as claimed in claim 1, further comprises a plurality of input/output buffers connected to the input terminals and output terminals of corresponding logic cells of said plurality of logic cells.

6. A semiconductor integrated circuit device, comprising:
    a logic cell array having a plurality of logic cells arranged in a matrix having a plurality of rows and columns, said logic cells respectively having input terminals and output terminals;
    interconnection lines mutually connecting said logic cells via said input and output terminals of the logic cells so that desired logic circuits are formed;
    a plurality of selectively actuable switch means, respectively provided for said logic cells, for selectively connecting the output terminals of each of said logic cells to said interconnection lines; and
    means for selectively directly supplying the input terminals of a selected one of said logic cells with desired data used for testing said semiconductor integrated circuit device;
    means for coordinating said data supply with control of said plurality of selectively actuable switch means to selectively disconnect the output terminals of said logic cells from said interconnection lines, and
    means for accessing said selected logic cell for evaluation of data within said cell;
    wherein said plurality of selectively actuable switch means comprises transistors respectively provided for said logic cells, said transistors respectively having ON/OFF control terminals, and said desired data passing through said transistors and being applied to said interconnection lines via said transistors; and
    said semiconductor integrated circuit device comprises select means for selecting said logic cells for every row and for applying a row select signal to the ON/OFF control terminals of said transistors related to a selected one of the rows so that said desired data is respectively applied to corresponding interconnection lines of said interconnection lines via said transistors related to said selected one of the rows and then applied to the input terminals of said logic cells connected to said corresponding interconnection lines related to said selected one of the rows.

7. A semiconductor integrated circuit device as claimed in claim 6, further comprising control lines respectively provided for said rows, wherein said control lines couple the ON/OFF control terminals of said transistors and said select means, and respectively carry said row select signal.

8. A semiconductor integrated circuit device as claimed in claim 7, further comprising column read/write lines respectively provided for said columns,
wherein said column read/write lines are coupled to the output terminals of said interconnection lines via said transistors.

9. A semiconductor integrated circuit device as claimed in claim 6, wherein each of said transistors is a field effect transistor having a gate terminal, and said ON/OFF control terminal corresponds to said gate terminal.

10. A semiconductor integrated circuit device as claimed in claim 6, further comprising shift register means for outputting said desired data received from an external device and for outputting data read out from said logic cells via said plurality of selectively actuable switch means to said external device.

11. A semiconductor integrated circuit device, comprising:
a logic cell array having a plurality of logic cells arranged in a matrix having a plurality of rows and columns, said logic cells respectively having input terminals and output terminals;
interconnection lines mutually connecting said logic cells via said input and output terminals of the logic cells so that desired logic circuits are formed;
a plurality of selectively actuable switch means, respectively provided for said logic cells, for selectively connecting the output terminals of each of said logic cells to said interconnection lines; and
means for selectively directly supplying the input terminals of a selected one of said logic cells with desired data used for testing said semiconductor integrated circuit device;
means for coordinating said data supply with control of said plurality of selectively actuable switch means to selectively disconnect the output terminals of said logic cells from said interconnection lines, and
means for accessing said selected logic cell for evaluation of data within said cell;
wherein said plurality of selectively actuable switch means respectively comprise analog switches, each provided between a corresponding one of the logic cells and a corresponding one of the interconnection lines, said analog switches respectively having ON/OFF control terminals; and
said semiconductor integrated circuit device comprise select means for selecting said logic cells for every column and for applying a select signal to the ON/OFF control terminals of said analog switches related to a selected one of the columns so that said analog switches related to said selected one of the columns are turned OFF when said logic cells related to said selected one of the columns are to be disconnected for corresponding interconnection lines of said interconnection lines and said desired data is to be respectively supplied to the input terminals of said logic cells connected to said analog switches related to said selected one of the columns via said corresponding interconnection lines.

12. A semiconductor integrated circuit device, comprising:
a logic cell array having a plurality of logic cells arranged in a matrix having a plurality of rows and columns, said logic cells respectively having input terminals and output terminals;
interconnection lines mutually connecting said logic cells via said input and output terminals of the logic cells so that desired logic circuits are formed;
a plurality of selectively actuable switch means, respectively provided for said logic cells, for selectively connecting the output terminals of each of said logic cells to said interconnection lines; and
means for selectively directly supplying the input terminals of a selected one of said logic cells with desired data used for testing said semiconductor integrated circuit device;
means for coordinating said data supply with control of said plurality of selectively actuable switch means to selectively disconnect the output terminals of said logic cells from said interconnection lines, and
means for accessing said selected logic cell for evaluation of data within said cell;
wherein each of said plurality of selectively actuable switch means comprises means for disconnecting a corresponding one of said logic cells from a pair of power sources.

13. A semiconductor integrated circuit device, comprising:
a logic cell array having a plurality of logic cells arranged in a matrix having a plurality of rows and columns, said logic cells respectively having input terminals and output terminals;
interconnection lines mutually connecting said logic cells via said input and output terminals of the logic cells so that desired logic circuits are formed;
a plurality of selectively actuable switch means, respectively provided for said logic cells, for selectively connecting the output terminals of each of said logic cells to said interconnection lines; and
means for selectively directly supplying the input terminals of a selected one of said logic cells with desired data used for testing said semiconductor integrated circuit device;
means for coordinating said data supply with control of said plurality of selectively actuable switch means to selectively disconnect the output terminals of said logic cells from said interconnection lines, and
means for accessing said selected logic cell for evaluation of data within said cell;
wherein each of said plurality of selectively actuable switch means comprises data setting means for setting the input terminal of a corresponding one of said logic cells to a desired logic level corresponding to said desired data via a corresponding one of said interconnection lines in a state where said corresponding one of the interconnection lines is disconnected from the input terminal of a corresponding one of said logic cells by a corresponding one of said plurality of switch means.

14. A semiconductor integrated circuit device as claimed in claim 13, further comprising:

first control lines respectively provided for said columns;

second control lines respectively provided for said rows; and select means for specifying said data setting means by selecting a corresponding one of said first control lines and a corresponding one of said second control lines and for making said data setting means set the input terminal of said corresponding one of the logic cells to said desired logic level.

15. A semiconductor integrated circuit device as claimed in claim 14, wherein said data setting means comprises:

an AND gate having a first input terminal coupled to said corresponding one of the first control lines, a second input terminal coupled to said corresponding one of the second control lines, and an output terminal;

a field effect transistor which is coupled between the output terminal of said AND gate and said corresponding one of the interconnection lines and which has a gate connected to the output terminal of said AND gate; and an inverter having an anode terminal connected to the gate of said field effect transistor, and a cathode terminal connected to a corresponding one of said plurality of selectively actuable switch means.

16. A semiconductor integrated circuit device as claimed in claim 15, wherein each of said plurality of selectively actuable switch means comprises a field effect transistor interposed between a corresponding one of said logic cells and said corresponding one of the interconnection lines, and a gate connected to the cathode terminal of said inverter.

17. A semiconductor integrated circuit device as claimed in claim 16, further comprising:

column read lines respectively provided for said columns;

a plurality of field effect transistors, each provided between a corresponding one of said logic cells and a corresponding one of said column read lines, data being read out from said corresponding one of the logic cells and output to said corresponding one of the column read lines, each of said field effect transistors having a gate;

row select lines respectively provided for said rows, each of said row select lines being connected to the gate of a corresponding one of said field effect transistors; and row select means for selecting logic cells related to one of said rows from said logic cells.

18. A semiconductor integrated circuit device as claimed in claim 13, further comprising:

first control lines respectively provided for said columns;

second control lines respectively provided for said rows;

third control lines respectively provided for said columns; and select means for specifying said data setting means by selecting a corresponding one of said first control lines, a corresponding one of said second control lines and a corresponding one of said third control lines and for making said data setting means set the input terminal of said corresponding one of the logic cells to said desired logic level.

19. A semiconductor integrated circuit device as claimed in claim 18, wherein said data setting means comprises:

an AND gate having a first input terminal coupled to said corresponding one of the first control lines, a second input terminal coupled to said corresponding one of the second control lines, and an output terminal;

a field effect transistor which is coupled between the output terminal of said AND gate and said corresponding one of the interconnection lines and which has a gate; and an inverter having a cathode terminal connected to the gate of said field effect transistor, and an anode terminal connected to a corresponding one of said plurality of selectively actuable switch means and a corresponding one of said third control lines.

20. A semiconductor integrated circuit device as claimed in claim 19, wherein each of said plurality of switch means comprises a field effect transistor interposed between a corresponding one of said logic cells and said corresponding one of the interconnection lines, and a gate connected to the anode terminal of said inverter and said corresponding one of the third control lines.

21. A semiconductor integrated circuit device as claimed in claim 20, further comprising:

column read lines respectively provided for said columns;

a plurality of field effect transistors, each provided between a corresponding one of said logic cells and a corresponding one of said column read lines, data being read out from said corresponding one of the logic cells and output to said corresponding one of the column read lines, each of said field effect transistors having a gate;

row select lines respectively provided for said rows, each of said row select lines being connected to the gate of a corresponding one of said field effect transistors; and row select means for selecting logic cells related to one of said rows from said logic cells.

* * * * *